United States Patent [19]
Kobayashi

[11] Patent Number: 5,840,595
[45] Date of Patent: Nov. 24, 1998

[54] CALIBRATION OF SEMICONDUCTOR PATTERN INSPECTION DEVICE AND A FABRICATION PROCESS OF A SEMICONDUCTOR DEVICE USING SUCH AN INSPECTION DEVICE

[75] Inventor: Katsuyoshi Kobayashi, Kawasaki, Japan

[73] Assignee: Fujitsu Limited, Kawasaki, Japan

[21] Appl. No.: 834,045

[22] Filed: Apr. 11, 1997

Related U.S. Application Data

[62] Division of Ser. No. 385,685, Feb. 8, 1995, Pat. No. 5,692,070.

[30] Foreign Application Priority Data

Mar. 15, 1994 [JP] Japan ..................................... 6-044469

[51] Int. Cl.⁶ .................................................. H01L 21/00
[52] U.S. Cl. .......................................................... 438/16
[58] Field of Search ...................................... 438/16, 401

[56] References Cited

U.S. PATENT DOCUMENTS 4,353,087 10/1982 Berry et al. ............................. 358/101
4,759,073 7/1988 Shah et al. .................................. 382/8
4,791,586 12/1988 Maeda et al. ........................... 364/491
5,444,481 8/1995 Oshima et al. ......................... 348/187
5,495,328 2/1996 Spence et al. .......................... 356/121

*Primary Examiner*—Brian Dutton
*Attorney, Agent, or Firm*—Armstrong, Westerman, Hattori, McLeland & Naughton

[57] ABSTRACT

A method of calibrating a pattern inspection device including the steps of determining a first position of a pattern formed on a substrate by holding the substrate on a stage with a first orientation and by illuminating the substrate by means of an optical system of the inspection device, determining a second position by holding the substrate on the stage with a second, different orientation and by illuminating the substrate by the foregoing optical system, and by comparing the first and second positions thus obtained. In each of the foregoing steps for detecting the first and second positions, two opposing edges of the pattern are detected from an image acquired from the substrate, wherein the first and second positions are determined as a midpoint of the two opposing edges.

5 Claims, 11 Drawing Sheets

FIG.1
PRIOR ART
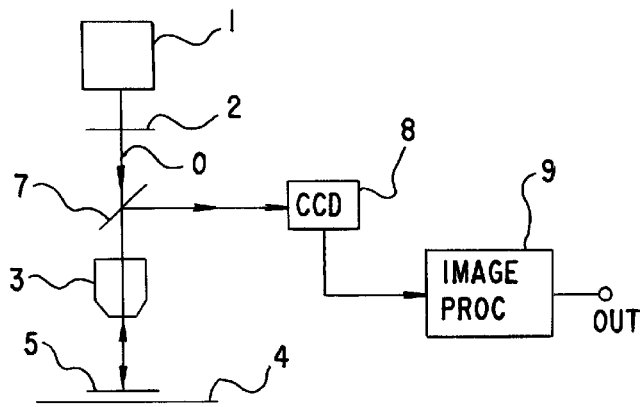
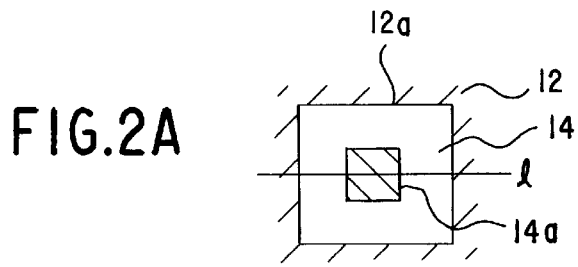
FIG.2A
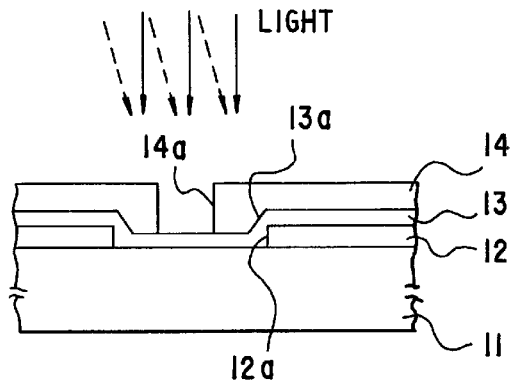
FIG.2B
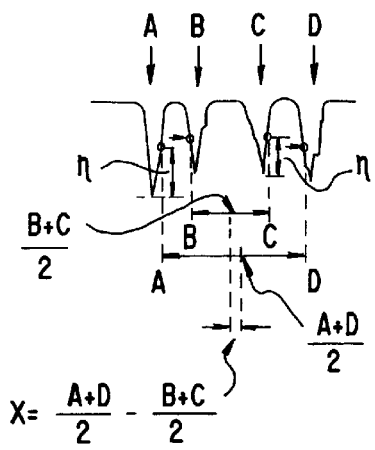
FIG.2C
$$X = \frac{A+D}{2} - \frac{B+C}{2}$$

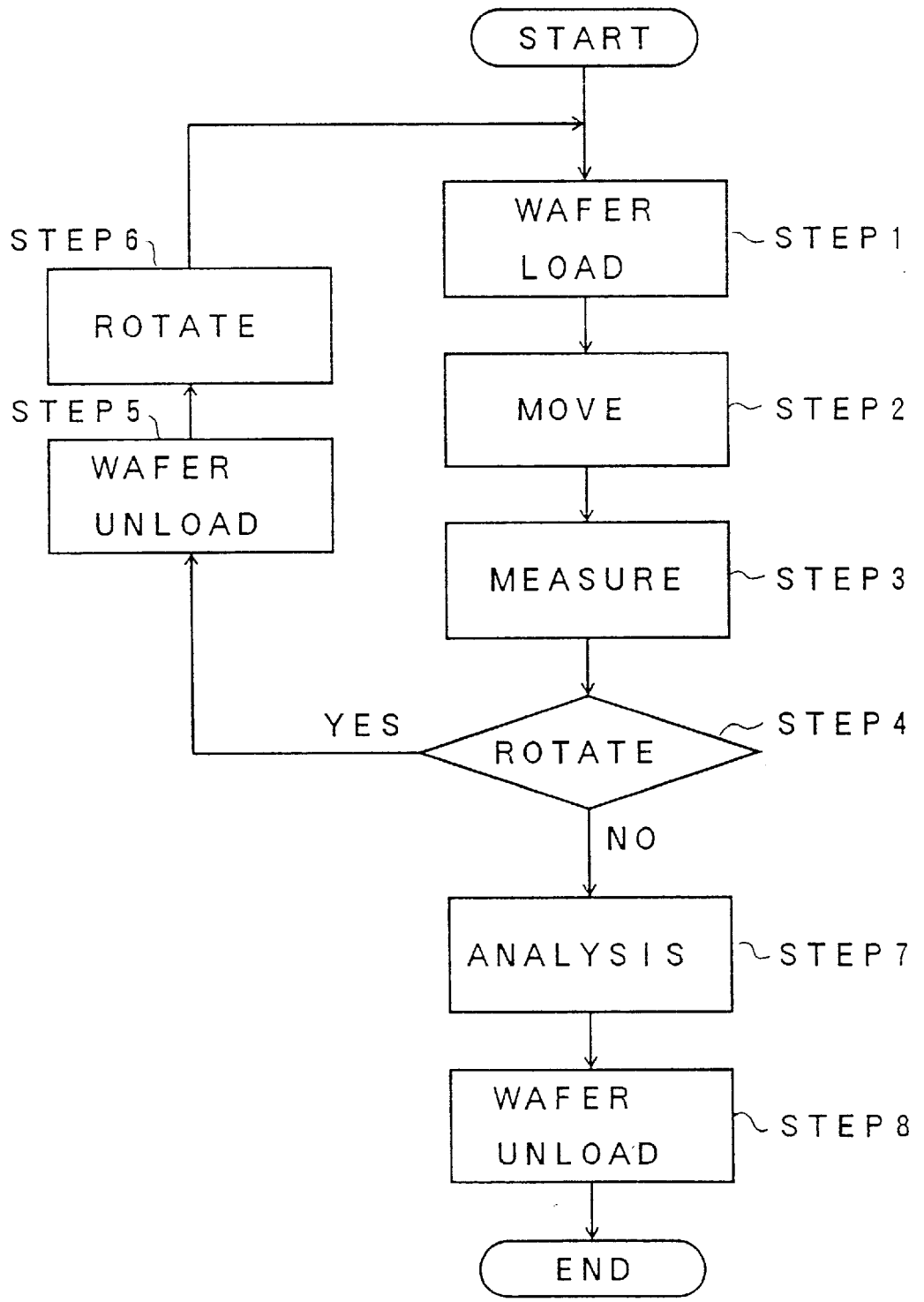

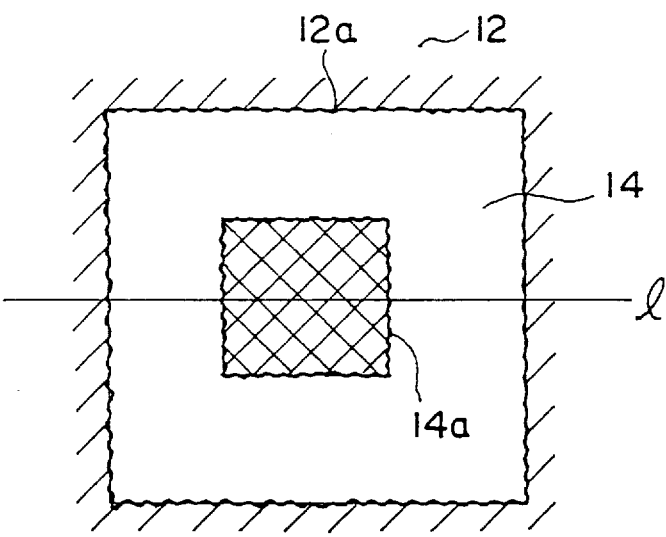
FIG. 11A
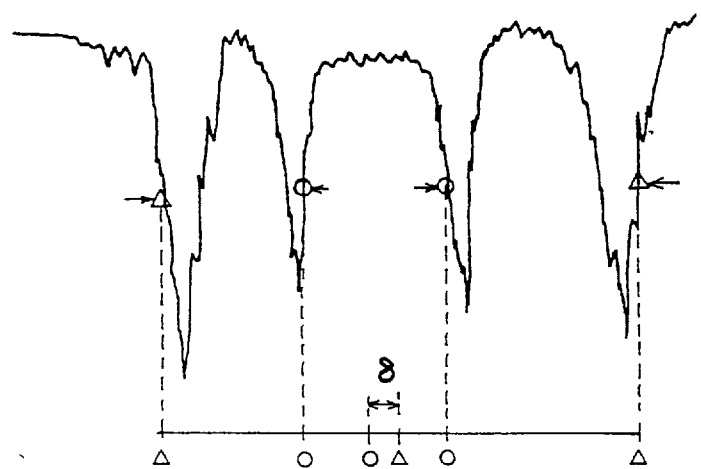
FIG. 11B
FIG. 11C
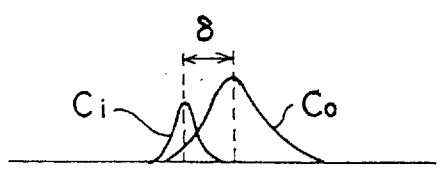
FIG. 11D

FIG. 12A
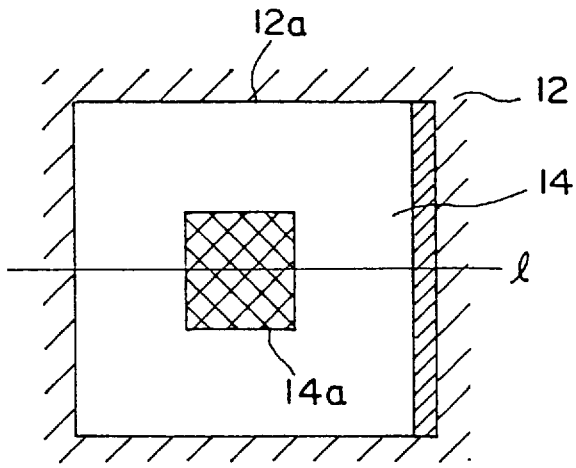
FIG. 12B
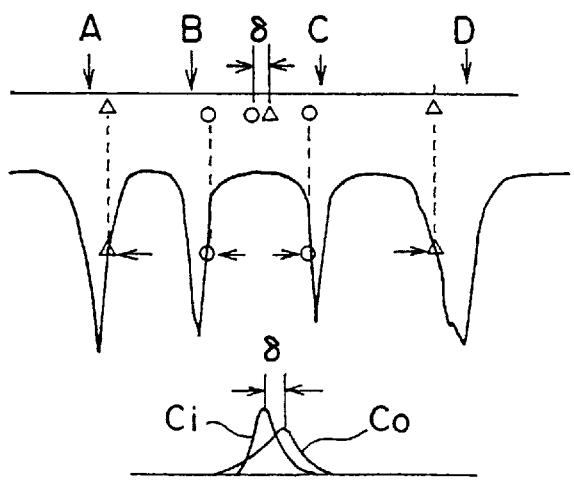
FIG. 12C

CALIBRATION OF SEMICONDUCTOR PATTERN INSPECTION DEVICE AND A FABRICATION PROCESS OF A SEMICONDUCTOR DEVICE USING SUCH AN INSPECTION DEVICE

This is a divisional of application Ser. No. 08/385,685 filed Feb. 8, 1995 now U.S. Pat. No. 5,692,070.

BACKGROUND OF THE INVENTION

1. Field of the Invention

The present invention generally relates to fabrication of semiconductor devices and more particularly to the calibration of a pattern inspection device used for inspecting various semiconductor patterns and/or insulator patterns forming a semiconductor device in the purpose of detecting pattern misalignment, as well as a fabrication process of a semiconductor device that uses such a semiconductor pattern inspection device.

2. Description of the Related Art

A typical semiconductor device includes a number of semiconductor patterns and insulator patterns stacked with one upon the. When forming such semiconductor or insulator patterns, therefore, it is necessary to achieve an exact alignment of various patterns.

When forming a second layer pattern on a first layer pattern formed previously, for example, a second layer is deposited on the foregoing first layer pattern and the second layer thus deposited is subsequently subjected to a lithographic patterning process to form the desired second layer pattern by forming a resist pattern. In such a patterning process, an exact alignment between the resist pattern acting as a mask and the underlying first layer pattern is required.

In order to guarantee such an alignment of patterns a conventional fabrication process of semiconductor devices includes an inspection process of the resist patterns, wherein the inspection process uses an inspection device that includes an optical microscope. It is thought that such an inspection process to be essential in the fabrication of large capacity semiconductor memories such as DRAMs having a storage capacity exceeding 16 Mbits.

FIG. 1 shows the construction of a conventional inspection device.

Referring to FIG. 1, the inspection device includes an optical source 1 such as a halogen lamp that emits an optical beam along a predetermined optical axis O. Further, there is provided a diaphragm 2 on the optical path of the optical beam, wherein the diaphragm 2 includes a pin-hole aligned with the optical axis O of the optical system for passing the optical beam therethrough. In the downstream side of the diaphragm 2, there is provided an objective lens 3 in alignment with the optical axis O, such that the lens 3 focuses the optical beam incident thereto upon a substrate 5 held on a stage 4.

The optical beam thus focused is then reflected by the substrate 5 and travels in a backward direction along the optical axis O. After passing through the lens O in the backward direction, the reflected optical beam is deflected by a semi-transparent mirror 7 and enters into a CCD imaging device 8. Thereby, the CCD imaging device 8 produces an image signal indicative of the pattern on the substrate surface and supplies the same to an image processor 9. The image processor 9, in turn, analyzes the image signal obtained by the CCD imaging device 8 for alignment of the second layer pattern with respect to the first layer pattern.

FIG. 2A shows, in a plan view, an example of the alignment mark formed on a substrate 11 that is subjected to inspection by the inspection device of FIG. 1, while FIG. 2B shows an elevational cross section of the substrate of FIG. 2A including the alignment mark. Further, FIG. 2C shows an image output signal produced by the CCD imaging device 8 of FIG. 1 in correspondence to the alignment mark of FIGS. 2A and 2B.

Referring to the cross sectional view of FIG. 2B showing the alignment mark provided on the substrate 11, the substrate 11 carries thereon a first layer pattern 12 including an opening 12a, and a second layer 13 is deposited on the first layer pattern 12, wherein the alignment mark is provided on the second layer 13 for inspecting the alignment of a resist pattern 14, which is provided on the second layer 13 as a mask pattern, with respect to the first layer pattern 12.

As will be noted in FIG. 2A, the resist pattern 14 includes an opening 14a provided inside a depression 13a formed in the layer 13 in correspondence to the opening 12a in the first layer pattern 12, wherein the depression 13a of the layer 13 acts as the alignment mark. In the description hereinafter, it is assumed that the opening 14a of the resist pattern is provided at the center of the depression 13a and hence the opening 12a for easy detection of the pattern misalignment. However, the present invention to be described later is by no means limited to such a particular construction of the alignment mark. It should be noted that the resist pattern 14 is formed with openings used for patterning the layer 13 or implanting ions into the layer 13, wherein such openings are formed with a predetermined relationship with respect to the opening 14a. Thus, by inspecting the alignment of the resist pattern 14 with respect to the underling pattern 12 by means of the alignment marks formed as such, it is possible to guarantee the desired exact alignment of the pattern 12 and the pattern 13 formed by using the mask pattern 14. As noted previously, such an inspection process is essential in fabricating large capacity DRAMs having a storage capacity exceeding 16 Mbits.

It should be noted that the alignment mark may be provided at several locations on the substrate 11 in correspondence to the scribe lines defined thereon.

FIG. 2C shows an example of the image signal taken along a line 1 shown in FIG. 2A.

Referring to FIG. 2C, it will be noted that there appears a sharp peak in the reflected optical beam in correspondence to the edge of the depression 13a due to large change in the reflectance occurring at such an edge of the depression 13. In the waveform of FIG. 2C, the peaks designated as A and D correspond to the two opposing edges of the depression 13a, while the peaks designated as B and C correspond to the two opposing edges of the opening 14a of the resist pattern 14. Thus, it is possible to obtain the center of the depression 13a by averaging the position of the peaks A and D as (A+D)/2. Similarly, it is possible to obtain the center of the depression 14a by averaging the position of the peaks B and C and (B+D)/2. Thereby, a deviation δ in the resist pattern 14 with respect to the first layer pattern 12 is obtained as a result of difference in the center between the opening 14a and the depression 13a as $$\delta = (B+C)/2 - (A+D)/2.$$

When it is judged that the deviation δ thus obtained exceeds an allowable limit, the resist pattern 14 is dissolved by a solvent and a new resist pattern is formed by depositing a new resist layer, followed by exposure and patterning.

In the process of FIG. 2C, it should be noted that the edge position corresponding to each peak is obtained by slicing the peaks at a predetermined threshold η. In such a process, the peaks A and D are determined by using inner or outer intercepts, while the peaks B and C are determined by using outer or inner intercepts, respectively. Herein, the phrase "intercept" means a crossing of the image signal over the foregoing threshold η, wherein the threshold η is measured, in each peak, with respect to the peak value. In the illustrated example, the threshold η may is set to 50% of the peak value.

In the inspection device of FIG. 1, there occurs a problem in that the optical beam, produced by the optical source 1, may impinge upon the substrate 11 obliquely as indicated by a broken line in FIG. 2B, when the optical axis O of the optical system including the diaphragm 2 and the lens 3, has an error and is set obliquely to the substrate. In such a case, a shadow of the edge defining the opening 14a may be projected upon the substrate 11, and the waveform of the image signal shown in FIG. 2C is distorted asymmetrically. When such an asymmetrically distorted peak is used for determining the center of the alignment mark, there can occur a false detection of apparent deviation δ' even in the case the pattern alignment is ideal and no pattern deviation actually exists. Thereby, desired exact pattern alignment is no longer possible.

In the conventional process shown in FIG. 2C, it should further be noted that the peak position is determined based upon the outer intercepts or inner intercepts of the threshold. Thereby, the peak position thus obtained is vulnerable to the noise that is caused in the output image signal of the CCD imaging device 8 by the effect of grain boundary or other rough surface that causes an irregular reflection of the optical beam. FIGS. 3A and 3B represent such a situation, wherein FIG. 3A shows the alignment mark in a plan view while FIG. 3B shows the waveform of the image signal obtained by the CCD imaging device 8. It will be obvious that the peak position determined based upon such an output image signal that contains noise is unreliable.

A similar error in the pattern alignment detection occurs also in the case where the edge defining an alignment mark is formed asymmetrical as indicated in FIGS. 4A and 4B. In the example of FIGS. 4A and 4B, it will be noted that there is an edge 12a' having a sloped surface such that the edge 12a' faces the edge 12a that has a vertical surface.

In such a case, the image signal obtained by the CCD imaging device 8 provides a broad peak for the edge 12a' as indicated by the peak D shown in FIG. 4D. As a result, the accuracy or reliability in determining the peak position for the peak D is inevitably deteriorated, and the alignment detection thus achieved based upon such a peak that includes deviation, results in error.

SUMMARY OF THE INVENTION

Accordingly, it is a general object of the present invention to provide a novel and useful calibration system of a semiconductor pattern inspection device and a fabrication process of a semiconductor device that uses such a calibration system wherein the foregoing problems are eliminated.

Another and more specific object of the present invention is to provide a calibration system and method of a pattern inspection device having an optical system, said inspection device inspecting a deviation in pattern alignment based upon an image of a pattern formed on a substrate, wherein the calibration system detects an error of an optical axis of the optical system.

Another object of the present invention is to provide a pattern alignment detection system that detects alignment of patterns based upon an acquired image of a pattern, as well as a fabrication process of a semiconductor device using such a pattern alignment detection system, wherein a reliable pattern alignment detection is achieved.

Another object of the present invention is to provide a calibration method of a pattern alignment inspection device, said pattern alignment inspection device comprising: an optical source designed to emit an optical beam along a predetermined, designed optical axis; a stage for holding a substrate that carries at least first and second patterns thereon; an optical system provided on said optical axis for illuminating said substrate on said stage by said optical beam produced by said optical source; an imaging device for imaging said substrate illuminated on said stage, said imaging device acquiring an image of said first pattern and an image of said second pattern; and an analyzing system supplied with said images of said first and second patterns for detecting a deviation in position between said first pattern and said second pattern; said method comprising the steps of:

(a) disposing said substrate upon said stage in a first orientation;

(b) acquiring an image of said substrate disposed on said stage in said step (a), by said imaging device;

(c) detecting a first positional offset between said first and second patterns on said substrate by processing said image of said substrate acquired in said step (b);

(d) disposing said substrate upon said stage with a second, different orientation;

(e) acquiring an image of said substrate disposed on said stage in said step (d), by said imaging device;

(f) detecting a second positional offset between said first and second patterns on said substrate by processing said image of said substrate acquired in said step (e); and (g) detecting a deviation of an optical axis of said optical system with respect to said predetermined designed optical axis by comparing said first offset and said second offset;

wherein said first orientation and said second orientation are mutually offset by 180 degrees.

Another object of the present invention is to provide a pattern inspection method for inspecting a pattern by means of a pattern alignment inspection device and a fabrication process of a semiconductor device that uses such a pattern inspection method, said pattern alignment inspection device comprising: an optical source designed to emit an optical beam along a predetermined, designed optical axis; a stage for holding a substrate that carries at least first and second patterns thereon; an optical system provided on said optical axis for illuminating said substrate on said stage by said optical beam produced by said optical source; an imaging device for imaging said substrate illuminated on said stage, said imaging device acquiring an image of said first pattern and an image of said second pattern; and an analyzing system supplied with said images of said first and second patterns for detecting a deviation in position between said first pattern and said second pattern; said method comprising the steps of:

(a) disposing said substrate upon said stage in a first orientation;

(b) acquiring an image of said substrate disposed on said stage in said step (a), by said imaging device;

(c) detecting a first positional offset between said first and second patterns on said substrate by processing said image of said substrate acquired in said step (b);

(d) disposing said substrate upon said stage with a second, different orientation;

(e) acquiring an image of said substrate disposed on said stage in said step (d), by said imaging device;

(f) detecting a second positional offset between said first and second patterns on said substrate by processing said image of said substrate acquired in said step (e);

detecting a deviation of an optical axis of said optical system with respect to said predetermined optical axis by comparing said first offset and said second offset; and detecting a mutual offset of said first pattern and said second pattern by applying a correction for correcting said deviation of said predetermined designed optical axis, upon one of said first and second offsets;

wherein said first orientation and said second orientation are mutually offset by 180 degrees.

Another object of the present invention is to provide a method of detecting a pattern position comprising the steps of: acquiring an image signal from a substrate carrying thereon a pattern defined by first and second edges, said image signal representing said pattern on said substrate; and detecting the position of said pattern as an midpoint of said first and second edges, said image signal including a first peak and a second peak respectively corresponding to said first and second edges, said method comprising the steps of:

slicing said image signal by a plurality of slice levels for obtaining cross points of said image signal and said slice level for each of said plurality of slice levels, said cross points being obtained for each of said first and second peaks;

obtaining a midpoint of said first and second edges by averaging said cross points in each of said plurality of slice levels;

obtaining a histogram indicative of a frequency of occurrence of said cross points for said plurality of slice levels; and determining the position of said pattern by determining a midpoint of said first and said edges as the position of said histogram wherein the frequency of occurrence becomes maximum.

Another object of the present invention is to provide a method for fabricating a semiconductor device, comprising the steps of:

acquiring an image signal from a substrate carrying thereon a first layer pattern defined by first and second edges and a second layer pattern defined by third and fourth edges, said image signal representing said first and second patterns; and detecting a positional offset of said second layer pattern with respect to said first layer pattern from said image signal, said step of detecting the positional offset comprising the steps of: determining a midpoint of said first and second edges as a first pattern position; determining a midpoint of said third and fourth edges as a second pattern position; and determining said positional offset from said first and second pattern positions;

wherein said image signal includes: a signal having first and second peaks in correspondence to said first and second edges respectively; and a signal having third and fourth peaks in correspondence to said third and fourth edges respectively;

wherein said step of detecting the positional offset comprises the steps of:

slicing said image signal at a plurality of slice levels for obtaining positions of a cross points of said image signal and said slice level, for each of said plurality of slice levels and for each of said first through fourth peaks;

obtaining, in each of said plurality of slice levels, a first midpoint between said first edge and said second edge, by averaging the positions of said cross points for said first peak and the positions of said cross points for said second peak;

obtaining, in each of said plurality of slice levels, a second midpoint between said third edge and said fourth edge, by averaging the positions of said cross points for said third peak and the positions of said cross points for said fourth peak;

obtaining a histogram indicative of a frequency distribution of said first midpoint for said plurality of slice levels;

obtaining a histogram indicative of a frequency distribution of said second midpoint for said plurality of slice levels;

determining the position of said first layer pattern as a maximum of said histogram of said first midpoint;

determining the position of said second layer pattern as a maximum of said histogram of said second midpoint; and determining a positional offset between said second layer pattern with respect to said first layer pattern from said position of said first layer pattern and said position of said second layer pattern.

According to the present invention, it is possible to detect any error of the optical system used in the pattern inspection device, by illuminating the substrate on a stage with different orientations and hence from different directions. By compensating for the effect of erroneous pattern position detection thus caused, it is possible to detect the real position or positional deviation of the patterns on the substrate.

Further, by slicing the peak in the image signal acquired by picturing the substrate at a plurality of slice levels, and by applying statistical processing to the position of the peak thus obtained, it is possible to achieve an exact pattern position detection.

Other objects and further features of the present invention will become apparent from the following detailed description when read in conjunction with the attached drawings.

BRIEF DESCRIPTION OF THE DRAWINGS

FIG. 1 is a diagram showing the construction of a conventional optical pattern inspection device;

FIGS. 2A–2C are diagrams showing a problem of the conventional device of FIG. 1;

FIG. 7 is a flowchart showing the inspection process according to a first embodiment of the present invention;

FIGS. 11A–11D are diagrams showing an example of the second embodiment process of the present invention;

FIGS. 12A–12C are diagrams showing another example of the second embodiment process of the present invention.

DETAILED DESCRIPTION OF PREFERRED EMBODIMENTS

First, the principle of the present invention will be described with reference to FIGS. 5A–5D.

Figure 5A:
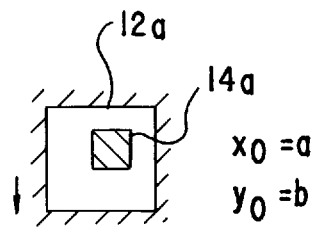
FIGS. 5A–5D are diagrams showing the principle of the present invention.

Referring to FIG. 5A, a substrate 5 that carries the alignment mark described with reference to FIGS. 2A and 2B is mounted upon the inspection device of FIG. 1, and a positional offset $(x_0, y_0)$ of the opening 14a with respect to the depression 13a is obtained according to the step described with reference to FIG. 2C, wherein $x_0$ represents the positional offset in the x-direction while $y_0$ represents the positional offset in the y-direction.

Figure 5B:
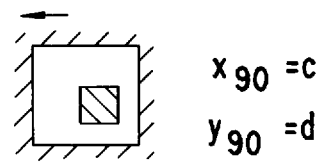

Next, in the step shown in FIG. 5B, the substrate 5 is taken out from the inspection device and is remounted after rotating the orientation by 90 degrees in the clockwise direction. Further, the positional offset of the opening 14a with respect to the depression 13a is obtained in this state as $x_{90}$, $y_{90}$.

Figure 5C:
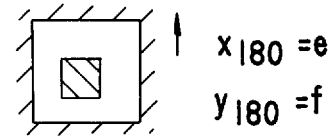

Further, in the step of FIG. 5C, the substrate 5 is again taken out from the inspection device and is remounted after rotating the orientation by 90 degrees in the clockwise direction. In this state, the positional offset of the opening 14a with respect to the depression 13a is obtained as $x_{180}$, $y_{180}$.

Figure 5D:
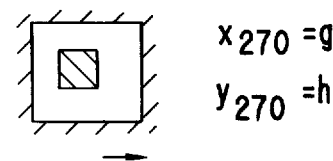

Further, in the step of FIG. 5D, the substrate 5 is again taken out from the inspection device and is remounted after rotating the orientation by 90 degrees in the clockwise direction. In this state, the positional offset of the opening 14a with respect to the depression 13a is obtained as $x_{270}$, $y_{270}$.

In each of the forgoing steps, it will be noted that the substrate 5 is rotated by 90 degrees. Thus, the substrate 5 of FIG. 5C has an orientation rotated by 180 degrees with respect to the state of FIG. 5A. When the optical beam from the optical source 1 is impinging upon the substrate 5 vertically without error in the optical system, therefore, the value of the positional offset of FIG. 5C is expected to have the same magnitude but opposite sign as compared with the positional offset of FIG. 5A. Similarly, the positional offset of FIG. 5D is expected to have the same magnitude but opposite sign as compared with the positional offset of FIG. 5B. In other words, the following relationship is expected for the device that is free from error in the optical system:

$$x_0 = -x_{180}, y_0 = -y_{180},$$

$$x_{90} = -x_{270}, y_{90} = -y_{270}.$$

When the foregoing relationship does not hold, on the other hand, this indicates that the optical system of the inspection device involves an error in the alignment of the optical axis. In such a case, therefore, the alignment error in the x- and y-directions are represented, in terms of $x_0$, $x_{90}$, $x_{180}$, $x_{270}$, $y_0$, $y_{90}$, $y_{180}$ and $y_{270}$, as $$\delta x_1 = (x_0 + x_{180})/2$$

$$\delta y_1 = (y_0 + y_{180})/2,$$

or $$\delta x_2 = (x_{90} + x_{270})/2$$

$$\delta y_2 = (y_{90} + y_{270})/2.$$

Alternatively, the alignment error may be represented by using the foregoing terms $\delta x_1$, $\delta y_1$, $\delta x_2$ and $\delta y_2$ as $$\delta x = (\delta x_1 + \delta x_2)/2 = (x_0 + x_{90} + x_{180} + x_{270})/4,$$

$$\delta y = (\delta y_1 + \delta y_2)/2 = (y_0 + y_{90} + y_{180} + y_{270})/4.$$

Further, it is possible to evaluate the difference in the magnification of the optical system between the x-direction and the y-direction as $$\begin{aligned}\delta xy_1 &= \{(x_0 - \delta x) + (y_{90} - \delta y) - \\ &\quad (x_{180} - \delta x) + (y_{270} - \delta y)\}/2 \\ &\quad \{(x_0 - x_{180}) + (y_{90} - y_{270})\}/2\end{aligned}$$

or $$\begin{aligned}\delta xy_2 &= \{(y_0 - \delta y) - (x_{90} - \delta x) - \\ &\quad (y_{180} - \delta y) + (x_{270} - \delta x)\}/2 \\ &\quad \{(y_0 - y_{180}) - (x_{90} - x_{270})\}/2\end{aligned}$$

or $$\begin{aligned}\delta xy &= (\delta xy_1 + \delta xy_2)/2 \\ &\quad \{(x_0 - x_{180}) + (y_{90} - y_{270}) + \\ &\quad (y_0 - y_{180}) - (x_{90} - x_{270})\}/4\end{aligned}$$

By compensating for the observed positional offset by the alignment error thus evaluated, it is possible to evaluate the true positional offset as $$x = x_0 - \delta_x,$$

$$y = y_0 - \delta_y - \delta_{xy}.$$

Next, a first embodiment of the present invention will now be described.

Figure 6:
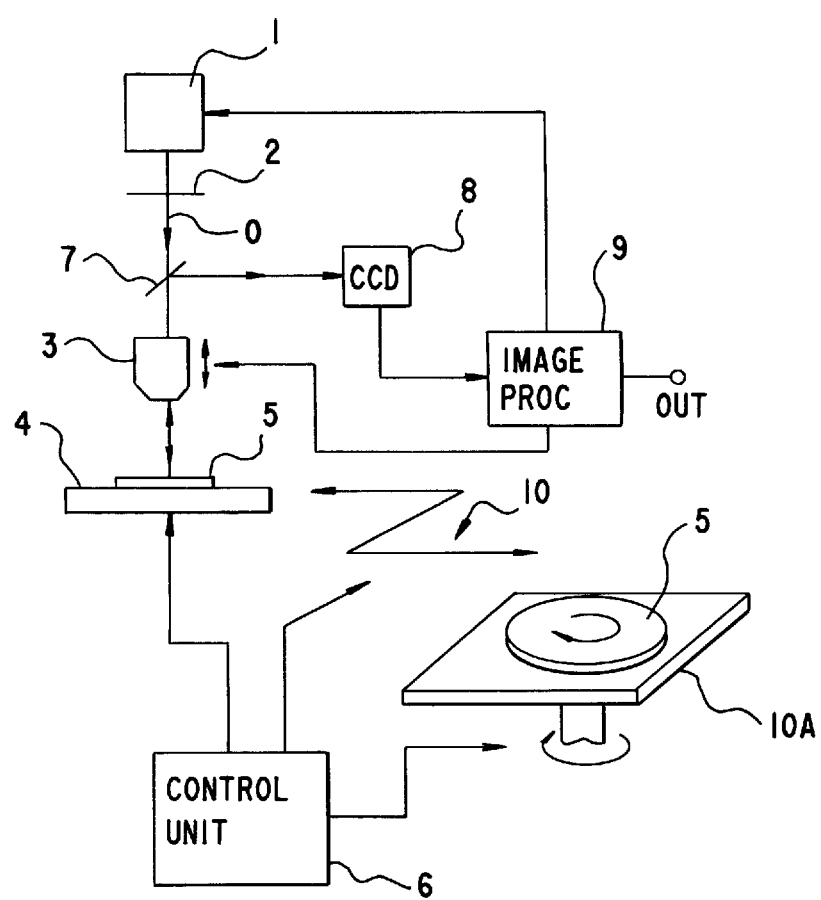
FIG. 6 is a diagram showing the construction of an inspection device to which the present invention is applied.

FIG. 6 shows an optical inspection device used in the present embodiment. Referring to FIG. 6, the inspection device has an optical system similar to the one shown in FIG. 1, and includes additionally a wafer loader 10 that mounts and dismounts the substrate or wafer 5 on and from the stage 4 by means of a robot arm. Further, it should be noted that there is provided a turntable 10A holding the substrate 5 dismounted from the stage 4 by the foregoing wafer loader 10. Thereby, the turntable 10A is so constructed as to rotate the substrate 5 thereon under control of a controller 6, wherein the controller 6 also controls the stage 4 and the wafer loader 10, in addition to the turntable 10A.

The stage 4 is movable in the X- and Y-directions and is driven by the controller 6 such that the alignment mark, provided on the substrate 5 and having the construction shown in FIGS. 2A and 2B, is located in alignment with the optical axis O of the lens 3. Further, the image processor 9 of FIG. 6 has a function for controlling the luminance of the optical source 2 based upon the image signal acquired by the CCD imaging device 8 and a function for controlling the lens 3 or the stage 4 in the vertical direction such that the optical beam is properly focused upon the substrate 5 held on the stage 4.

FIG. 7 shows the process conducted by the device of FIG. 6 in the form of a flowchart.

Referring to FIG. 7, the wafer loader 10 is activated in a step 1 for loading the substrate 5 upon the stage 4 with a first orientation shown in FIG. 5A. Next, in a step 2, the stage 4 is driven such that the alignment mark formed on the substrate 5 is located at a position corresponding to the optical axis O. Next, a step 3 is conducted wherein the image of the alignment mark on the substrate 5 is acquired by the imaging device 8. The imaging device 8 thereby produces an image signal of the alignment mark.

Next, in a step 4, a discrimination is made whether it is necessary to rotate the substrate 5 and carry out the imaging of the alignment mark again. If the result of the discrimination is YES, the loader 10 is reactivated in a step 5 such that the substrate 5 is dismounted from the stage 4. The substrate 5 thus dismounted is then turned by 90 degrees on the turntable 10A in a step 6. After the step 6, the process step returns to the step 1, and the processes of the steps 1–6 are repeated a plurality of times, each time with a rotation in the substrate orientation by 90 degrees. After the substrate 5 being rotated by 270 degrees, the looping back in the step 4 is terminated and the analysis of the image signals obtained by the CCD imaging device 8 is conducted in a step 7. More particularly, the positional offset of the upper pattern with respect to the lower pattern is obtained in the step 7 for each of the four substrate orientations, and the error in the optical alignment of the lens 3 and the diaphragm 2 is detected according to the mathematical process described previously. After the process of the step 7 is completed, the substrate 5 is dismounted from the stage 4 by the unloader 10 in a step 8.

As described previously, the positional offsets $(x_0, y_0)$, $(x_{90}, y_{90})$, $(x_{180}, y_{180})$, $(x_{270}, y_{270})$ are obtained in the step 7 by comparing the center of the edges defining the opening 14a and the center of the edges defining the depression 13a. Further, based upon the same, the alignment errors $\delta x$ and $\delta y$ are evaluated according to the relationship $$\delta x_1 = (x_0 + x_{180})/2$$

$$\delta y_1 = (y_0 + y_{180})/2,$$

or $$\delta x_2 = (x_{90} + x_{270})/2$$

$$\delta y_2 = (y_{90} + y_{270})/2,$$

or $$\delta x = (\delta x_1 + \delta x_2)/2 = (x_0 + x_{90} + x_{180} + x_{270})/4,$$

$$\delta y = (\delta y_1 + \delta y_2)/2 = (y_0 + y_{90} + y_{180} + y_{270})/4.$$

Further, the difference in the magnification between the x-direction and the y-direction is evaluated according to the relationship $$\delta xy_1 = \{(x_0 - \delta x) + (y_{90} - \delta y) - (x_{180} - \delta x) - (y_{270} - \delta y)\}/2$$

or $$\delta xy_2 = \{(y_0 - \delta y) - (x_{90} - \delta x) - (y_{180} - \delta y) + (x_{270} - \delta x)\}/2$$

or $$\delta xy = (\delta xy_1 + \delta xy_2)/2,$$

as already noted.

In the case where $x_0=0.03$, $y_0=-0.02$, $x_{90}=-0.04$, $y_{90}=-0.01$, $x_{180}=-0.05$, $y_{180}=0.09$, $x_{270}=0.04$ and $y_{270}=0.06$, the alignment error is given according to the third set of the equations above as $\delta x=-0.005$ and $\delta y=0.03$. Further, the sixth set of the foregoing equations provides a x-y magnitude difference $\delta xy$ as $\delta xy=-0.005$. Thereby, the true positional offset x and y are given from the equations foregoing $x=x_0-\delta x$ and $y=y_0-\delta y-\delta xy$ as $x=0.035$ and $y=-0.005$.

In the event where the difference $\Phi$ between the scale of the image acquired by the CCD imaging device 8 and the scale of the real device is known, for example as a result of observation by a scanning electron microscope and the like, one may modify the foregoing equations by the term $\Phi$ as $$x = \Phi + x_0 - \delta x$$

$$y = \Phi + y_0 - \delta y - \delta_{xy}.$$

Figure 8A:
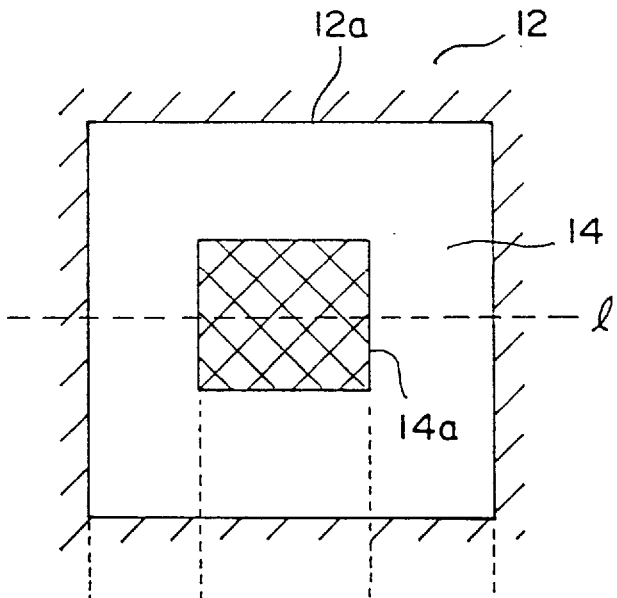
FIGS. 8A–8C are diagrams showing the principle of the inspection process according to a second embodiment of the present invention.
Figure 8B:
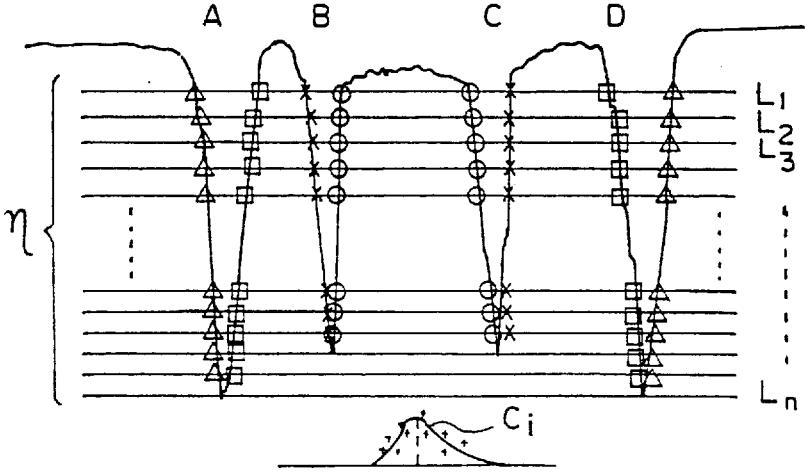

Next, a second embodiment of the present invention will be described with reference to FIGS. 8A and 8B wherein FIGS. 8A and 8B show an alignment marker pattern similar to the one described with reference FIG. 2A. Particularly, FIG. 8A shows the alignment marker in a plan view while FIG. 8B shows the image signal obtained by the CCD imaging device 8 as a result of scanning of the alignment marker of along the line 1 represented in FIG. 8A.

Referring to FIG. 8B, it will be noted that the image signal has peaks in correspondence to the edges of the patterns in FIG. 8A, wherein the peaks are sliced at a plurality of levels $L_1$–$L_n$ that are set to fall within a range __, wherein the range __ is measured from the peak level in each of the peaks.

Figure 8C:
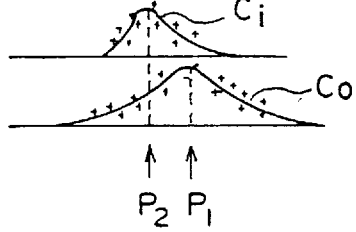

In the present embodiment, the inner and outer cross points of the peaks A and D with respect to the slice levels $L_1$–$L_n$, respectively represented in FIG. 8B by squares and triangles, are obtained. Further, the midpoint of these two peaks A and D, represented by two triangles and two squares, is calculated for each of the slice levels, by simply averaging the positions of the cross points for the peak A, represented by a triangle and a square, and the positions of the cross points of the peak D, represented by a triangle and a square, for each of the slice levels. The midpoints thus obtained are then plotted in a histogram as indicated in FIG. 8C, wherein FIG. 8C shows a curve $C_o$ that represents the frequency of occurrence of the midpoints between the peak A and the peak D thus obtained. Similarly, the frequency of occurrence of the midpoint for the peaks B and C is represented in FIG. 8C by a curve $C_i$, wherein the midpoints thus obtained correspond to the center of the opening 14a.

In FIG. 8C, it will be noted that the curve $C_o$ has a maximum at a position $P_1$, wherein the position $P_1$ represents the estimated center of the depression 13a and hence the opening 12a. similarly, the maximum of the curve $C_i$ at a position $P_2$ represents the estimated center of the opening 14a. Thus, it is possible to calculate the deviation in the center of the patterns between the depression 13a and the opening 14a by calculating the difference between the position $P_1$ and the position $P_2$.

In the process of the present invention, it should be noted that the positions $P_0$ and $P_1$ are obtained from the entirety of the curve $C_o$ or curve $C_i$ and no substantial degradation occurs in the accuracy of the pattern position thus obtained, even when the image signal of the CCD imaging device 8 includes noise therein. The determination of the positions $P_0$ and $P_1$ may be preferably conducted by fitting a suitable function such as the Gauss function by the least square fitting process or any other suitable statistic process. Thereby, the undesirable effect of noise in the determination of the pattern position is further minimized.

Figure 9:
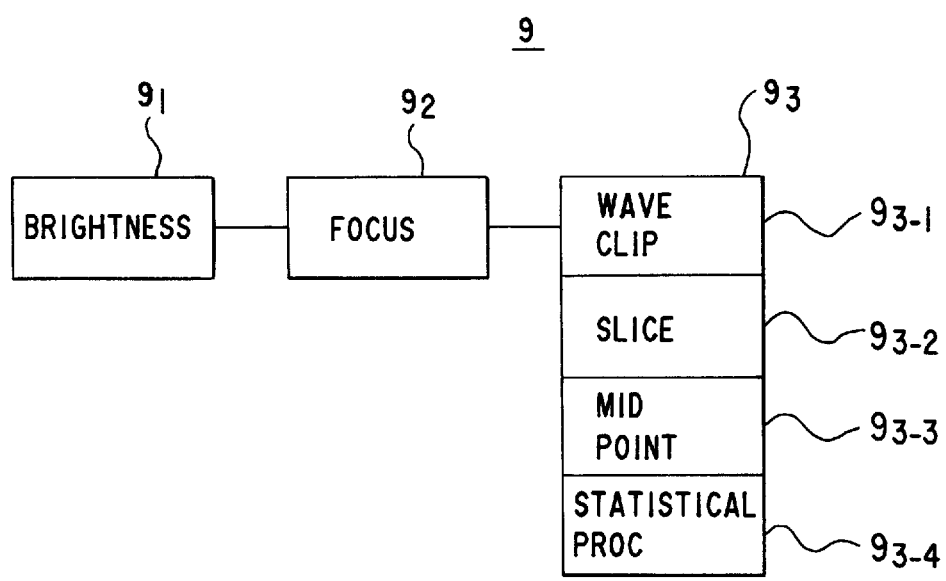
FIG. 9 is a functional block diagram showing the construction of the inspection device used in the second embodiment of the present invention.

FIG. 9 shows a construction for implementing the process of the second embodiment of the present invention described with reference to FIGS. 8B and 8C.

Referring to FIG. 9, it will be noted that the image processor 9 includes a brightness control unit $9_1$ for controlling the optical source 1 based upon the detection of the image signal level such that an optimum image is acquired, a focusing control unit $9_2$ that causes the lens 3 or the stage 4 to move up and down along the optical axis for achieving an optimum focusing, and an image processing unit $9_3$ for processing the image thus acquired. The image processing unit $9_3$ thereby includes a wave clipping unit $9_{3-1}$ for extracting an image profile from the image signal supplied to the processor 9 along a predetermined line 1, a slicing unit $9_{3-2}$ for slicing the image profile obtained by the wave clipping unit $9_{3-1}$ at the slice levels $L_1$–$L_n$ to obtain the cross points, a pattern center evaluation unit $9_{3-3}$ for calculating the midpoint of the pattern edges based upon the cross points obtained by the slicing unit $9_{3-2}$, and a statistical processing unit $9_{3-4}$ for processing the midpoints obtained by the pattern center evaluation unit $9_{3-3}$ for calculating the peaks $P_1$ and $P_2$.

Figure 10:
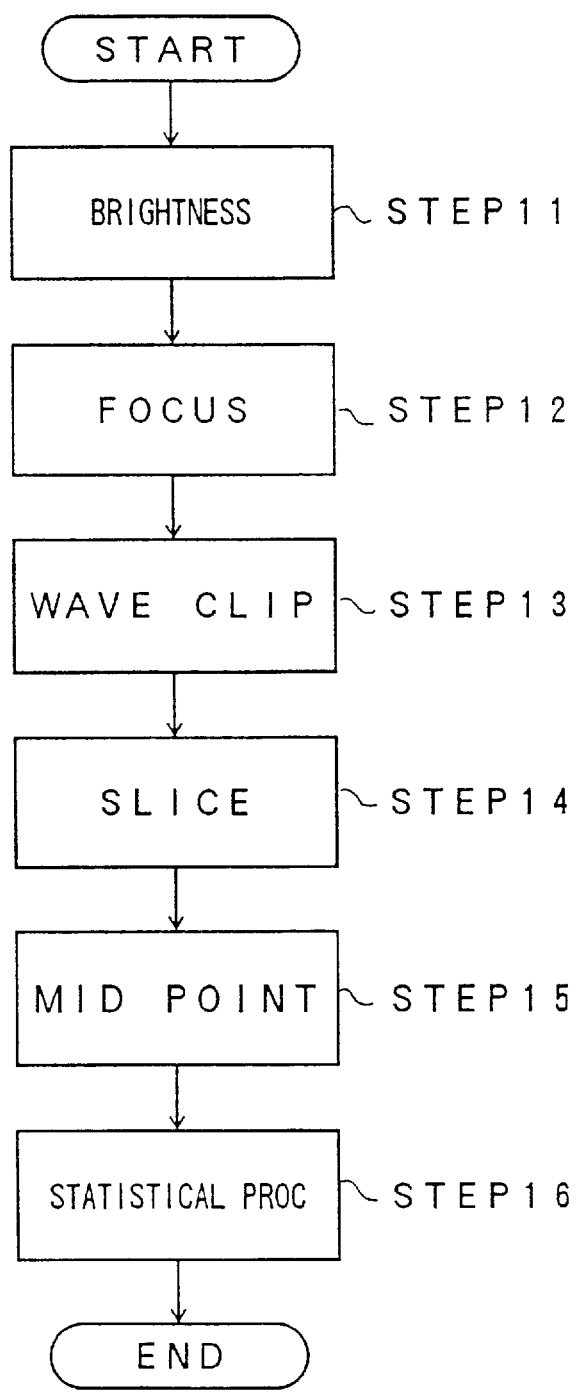
FIG. 10 is a flowchart showing the inspection process according to the second embodiment of the present invention.

FIG. 10 shows the process conducted by the image processor of FIG. 9 in the form of flowchart.

Referring to FIG. 10, the brightness control unit $9_1$ is activated in a step 11 such that the brightness of the optical source is optimized, followed by a step 12 in which the focusing control unit $9_2$ is activated for optimizing the focusing of the optical beam on the substrate 5. Next, the wave clipping unit $9_{3-1}$ is activated in a step 13 for extracting a profile of image signal as indicated in FIG. 8B, and the slicing unit $9_{3-2}$ is activated subsequently to slice the image signal profile at the slice levels $L_1$–$L_n$. Further, a step 15 is conducted in which the midpoints are calculated by the pattern center evaluation unit $9_{3-3}$ for each of the slice levels, and a step 16 is conducted subsequently in which the peak position is calculated by the statistical processing unit $9_{3-4}$ for the peaks $P_0$ and $P_1$ by way of a statistical process such as the least square fitting.

FIGS. 11A–11D show an example in which the image processing of the present embodiment is applied to a pattern having rough pattern edges 12a and 14a due to rough pattern surface, wherein FIG. 11A shows the pattern in a plan view while FIGS. 11B and 7C show the conventional process for obtaining the pattern position or positional offset δ by using the illustrated cross points, represented by open circles and open triangles, alone. Further, FIG. 11D shows the pattern position calculation according to the present embodiment.

As already noted, the process of the present invention shown in FIG. 11D achieves the pattern position determination by using the entirety of the image signal profile, and a reliable detection of the pattern position is possible for the positional offset δ even when the image signal contains substantial noise. This advantage is even enhanced by conducting the pattern position determination in combination with the statistic processing.

On the other hand, the conventional process of FIG. 11C is vulnerable to the noise in the image signal cannot provide a reliable pattern position determination. It will be noted that the positional offset δ in FIG. 11D is substantially different from the positional offset δ of FIG. 11C.

Figure 3A:
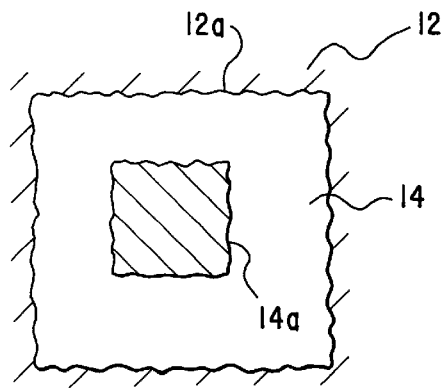
FIGS. 3A and 3B are diagrams showing another problem of the conventional device of FIG. 1.
Figure 3B:
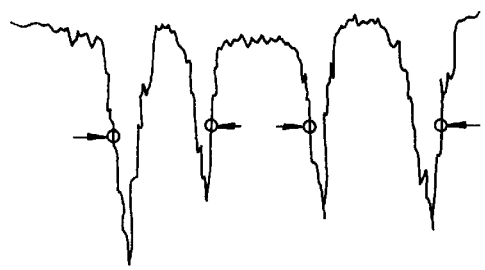
Figure 4A:
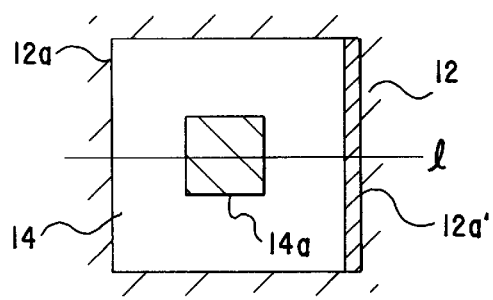
FIGS. 4A–4C are diagrams showing a further problem of the conventional device of FIG. 1.
Figure 4B:
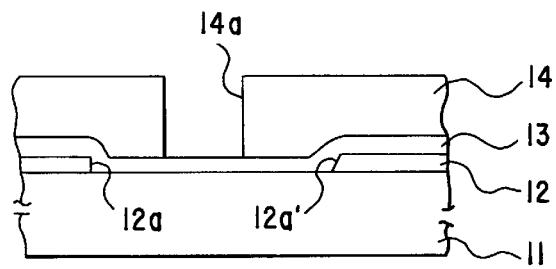
Figure 4C:
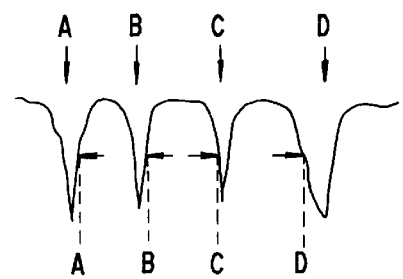

Further, FIGS. 12A–12C show an example of applying the image processing process of the present invention to the pattern that has an asymmetric cross section as in the case of FIGS. 4A–4C, wherein FIG. 12A shows the pattern in a plan view while FIG. 12B corresponds to FIGS. 11B and 11C and shows the conventional process for determining the positional offset δ. Further, FIG. 12C shows the process of the present invention.

As already noted with reference to FIGS. 4A–13C, the patterns having an asymmetric cross section generally provides a broader peak for the peak D that corresponds to the edge having a shallower slope. Thus, there inevitably occurs an error in the determination of the positional offset δ when one uses only a part of the peaks A and D as indicated in FIG. 12B. In the present invention, on the other hand, one obtains a reliable positional offset δ as indicated in FIG. 12C, even when the peak D is broad due to the asymmetric cross section of the pattern edges, as a result of use of the entirely of the image signal for the determination of the positional offset In the pattern of FIG. 12A wherein the pattern edges are asymmetric, there may occur a case in which the histogram of the midpoints becomes asymmetric as represented by the curve $C_i$ of FIG. 12C. In such a case, it is possible to apply a compensation for rectifying the asymmetric curve $C_i$ to become symmetric. For example, such a compensation may be achieved by applying a weighted sum when averaging the position of the cross points in the statistical processing unit $9_{3-4}$.

Figure 13A:
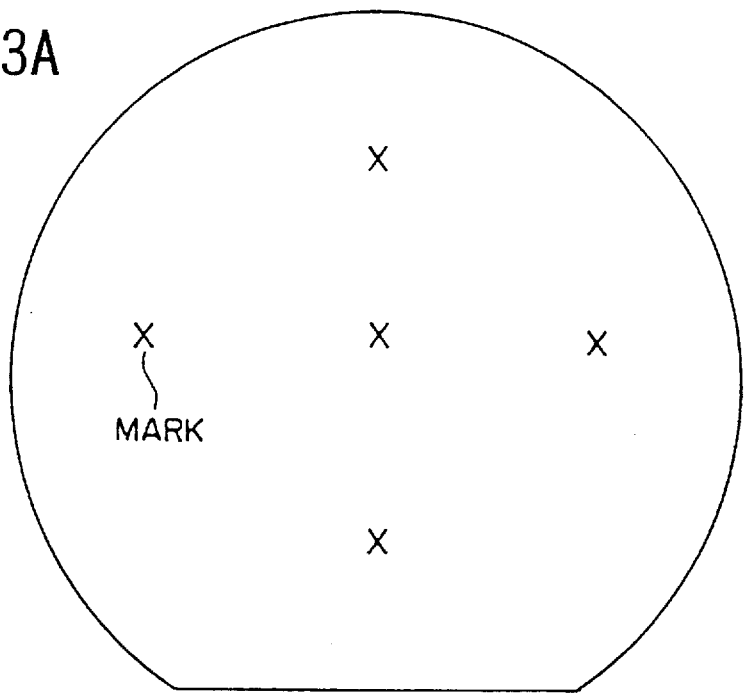
FIGS. 13A and 13B are diagrams showing an example of the present invention as applied to the fabrication of a semiconductor device.
Figure 13B:
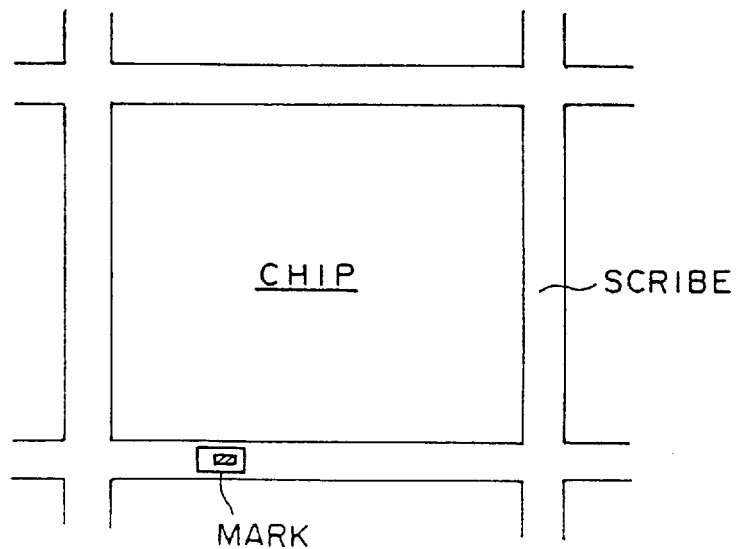

FIGS. 13A and 13B show the alignment mark as formed on a semiconductor wafer that corresponds to the substrate 11, wherein FIG. 13A shows the overall view of the wafer while FIG. 13B shows a part of the wafer in an enlarged scale. In FIG. 13A, it should be noted that the alignment mark is represented by "x."

Referring to FIG. 13A, the alignment mark is provided at a plurality of locations such that the alignment of the mask pattern with respect to the underlying pattern is checked at such plurality of locations. When intolerable error is detected as a result of such an inspection, the resist pattern is dissolved into an organic solvent and a new resist pattern is formed. As indicated in FIG. 13B, such alignment marks are preferably provided on the scribe lines defined on the substrate. It should be noted that the present invention as set forth with reference to the first and second embodiments are useful for such a fabrication process of semiconductor devices that includes the pattern inspection process based upon the alignment mark.

As noted previously, it is not necessary in the present invention to form the opening 14a at the center of the alignment mark 13a but may be provided with a predetermined offset from the center of the mark 13a, as long as the opening 14a is formed inside the mark 13a. Even in such a case it is possible to detect the misalignment of the pattern 14 with respect to the pattern 12 by comparing the center of the depression 13a and the center of the opening 14a.

Further, the present invention is not limited to the embodiments described heretofore, but various variations and modifications may be made without departing from the scope of the invention.

What is claimed is:

1. A method for fabricating a semiconductor device that includes a pattern inspection step for inspecting a pattern by means of a pattern alignment inspection device, said pattern alignment inspection device comprising: an optical source designed to emit an optical beam along a predetermined, designed optical axis; a stage for holding a substrate that carries at least first and second patterns thereon; an optical system provided on said optical axis for illuminating said substrate on said stage by said optical beam produced by said optical source; an imaging device for imaging said substrate illuminated on said stage, said imaging device acquiring an image of said first pattern and an image of said second pattern; and an analyzing system supplied with said images of said first and second patterns for detecting a deviation in position between said first pattern and said second pattern; said method comprising the steps of:

(a) disposing said substrate upon said stage in a first orientation;

(b) acquiring an image of said substrate disposed on said stage in said step (a), by said imaging device;

(c) detecting a first positional offset between said first and second patterns on said substrate by processing said image of said substrate acquired in said step (b);

(d) disposing said substrate upon said stage with a second, different orientation;

(e) acquiring an image of said substrate disposed on said stage in said step (d), by said imaging device;

(f) detecting a second positional offset between said first and second patterns on said substrate by processing said image of said substrate acquired in said step (e);

detecting a deviation of an optical axis of said optical system with respect to said designed optical axis by comparing said first offset and said second offset; and detecting a mutual offset of said first pattern and said second pattern by applying a correction for correcting said deviation of said designed optical axis, upon one of said first and second offsets;

wherein said first orientation and said second orientation are mutually offset by 180 degrees.

2. A method of detecting a pattern position comprising the steps of:

acquiring an image signal from a substrate carrying thereon a pattern defined by first and second edges, said image signal representing said pattern on said substrate;

detecting the position of said pattern as a midpoint of said first and second edges, said image signal including a first peak and a second peak respectively corresponding to said first and second edges;

slicing said image signal at a plurality of slice levels for obtaining cross points of said image signal and a slice level for each of said plurality of slice levels, said cross points being obtained for each of said first and second peaks;

obtaining said midpoint of said first and second edges by averaging said cross points in each of said plurality of slice levels;

obtaining a histogram indicative of a frequency of occurrence of said cross points for said plurality of slice levels; and determining the position of said pattern by determining said midpoint of said first and second edges as the position of said histogram wherein the frequency of occurrence becomes maximum.

3. A method as claimed in claim 2, wherein said step of slicing for obtaining the cross points includes the step of obtaining the position of first and second cross points corresponding to said slice level for each of said first and second peaks.

4. A method as claimed in claim 2, wherein said step of obtaining the histogram includes a step of obtaining a distribution of said cross points for said plurality of slice levels, and a step of applying a statistical analysis to said distribution of the cross points.

5. A method for fabricating a semiconductor device, comprising the steps of:

acquiring an image signal from a substrate carrying thereon a first layer pattern defined by first and second edges and a second layer pattern defined by third and fourth edges, said image signal representing said first and second layer patterns; and detecting a positional offset of said second layer pattern with respect to said first layer pattern from said image signal, said step of detecting the positional offset comprising the steps of: determining a midpoint of said first and second edges as a first pattern position; determining a midpoint of said third and fourth edges as a second pattern position; and determining said positional offset from said first and second pattern positions;

wherein said image signal includes: a signal having first and second peaks in correspondence to said first and second edges, respectively; and a signal having third and fourth peaks in correspondence to said third and fourth edges, respectively;

wherein said step of detecting the positional offset further comprises the steps of:

slicing said image signal at a plurality of slice levels for obtaining positions of cross points of said image signal and said slice level for each of said plurality of slice levels and for each of said first through second, third and fourth peaks;

obtaining, in each of said plurality of slice levels, a first midpoint between said first edge and said second edge, by averaging the positions of said cross points for said first peak and the positions of said cross points for said second peak;

obtaining, in said each of said plurality of slice levels, a second midpoint between said third edge and said fourth edge, by averaging the positions of said cross points for said fourth peak;

obtaining a histogram indicative of a frequency distribution of said first midpoint for said plurality of slice levels;

obtaining a histogram indicative of a frequency distribution of said second midpoint for said plurality of slice levels;

determining the position of said first layer pattern as a maximum of said histogram of said first midpoint;

determining the position of said second layer pattern as a maximum of said histogram of said second midpoint; and determining a positional offset between said second layer pattern with respect to said first layer pattern from said position of said first layer pattern and said position of said second layer pattern.

* * * * *